United States Patent
Ikeda et al.

(10) Patent No.: US 10,749,101 B2
(45) Date of Patent: Aug. 18, 2020

(54) PIEZOELECTRIC ELEMENT AND PIEZOELECTRIC ACTUATOR

(71) Applicant: TDK CORPORATION, Tokyo (JP)

(72) Inventors: Yoshiki Ikeda, Minato-ku (JP); Kazuo Nagata, Minato-ku (JP); Shuto Ono, Minato-ku (JP); Syogo Saito, Minato-ku (JP)

(73) Assignee: TDK CORPORATION, Tokyo (JP)

( * ) Notice: Subject to any disclaimer, the term of this patent is extended or adjusted under 35 U.S.C. 154(b) by 433 days.

(21) Appl. No.: 15/363,800

(22) Filed: Nov. 29, 2016

(65) Prior Publication Data
US 2017/0155033 A1 Jun. 1, 2017

(30) Foreign Application Priority Data
Nov. 30, 2015 (JP) .................. 2015-233748

(51) Int. Cl.
*H01L 41/09* (2006.01)
*G11B 5/48* (2006.01)
*H01L 41/047* (2006.01)

(52) U.S. Cl.
CPC .......... *H01L 41/0933* (2013.01); *G11B 5/483* (2015.09); *H01L 41/0475* (2013.01)

(58) Field of Classification Search
CPC ............... H01L 41/0933; H01L 41/047; H01L 41/0472; H01L 41/0474; H01L 41/0475
USPC .................. 310/328, 348, 365, 366
See application file for complete search history.

(56) References Cited

U.S. PATENT DOCUMENTS

| | | | |
|---|---|---|---|
| 2002/0084724 A1* | 7/2002 | Morinaga | H03H 9/177 310/366 |
| 2003/0161076 A1 | 8/2003 | Shibata et al. | |
| 2004/0084999 A1 | 5/2004 | Yamauchi | |
| 2005/0274543 A1* | 12/2005 | Sasaki | H01L 41/0474 174/255 |
| 2006/0044697 A1 | 3/2006 | Shibata et al. | |
| 2006/0209128 A1* | 9/2006 | Murai | B41J 2/161 347/54 |
| 2011/0025168 A1* | 2/2011 | Maruyama | H01L 41/0906 310/323.06 |
| 2011/0242225 A1 | 10/2011 | Yamashita | |

(Continued)

FOREIGN PATENT DOCUMENTS

| | | |
|---|---|---|
| JP | 2003-215152 A | 7/2003 |
| JP | 2011-212901 A | 10/2011 |
| JP | 2012-155832 A | 8/2012 |

*Primary Examiner* — Derek J Rosenau
(74) *Attorney, Agent, or Firm* — Oliff PLC

(57) ABSTRACT

A piezoelectric element includes a piezoelectric body, a first electrode, a second electrode, a third electrode, and a first through hole conductor. The piezoelectric body includes first and second main surfaces opposing each other, and first and second end surfaces opposing each other. The first electrode is disposed on the first main surface. The second electrode is disposed apart from the first electrode on the first main surface. The third electrode is disposed in the piezoelectric body to oppose the first electrode. The first through hole conductor is connected to the second and third electrodes. The piezoelectric body includes an active region and an inactive region. The active region includes a region from the first electrode to the third electrode. The inactive region includes a region from the third electrode to the second main surface.

7 Claims, 8 Drawing Sheets

(56) References Cited

U.S. PATENT DOCUMENTS

| | | |
|---|---|---|
| 2012/0176703 A1 | 7/2012 | Nojima |
| 2015/0022058 A1* | 1/2015 | Okamura ............ H01L 41/0472 |
| | | 310/332 |
| 2015/0028726 A1* | 1/2015 | Kim .................... H01L 41/0474 |
| | | 310/365 |

* cited by examiner

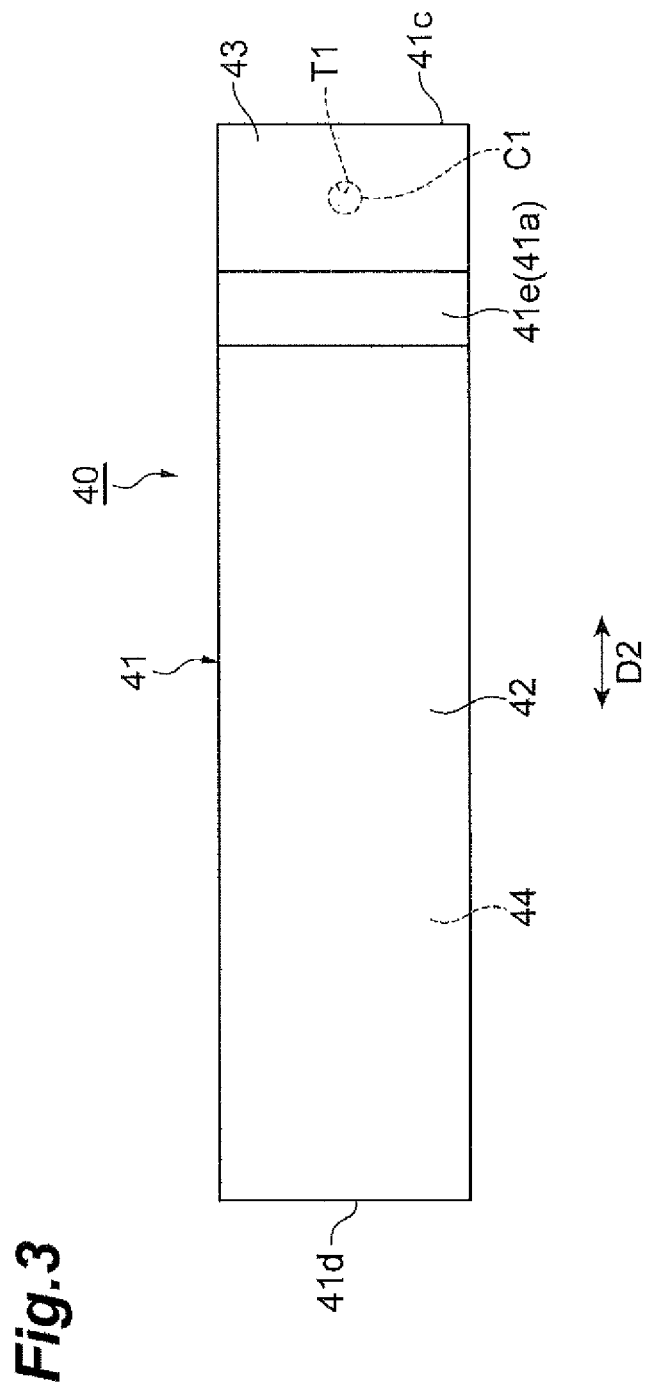

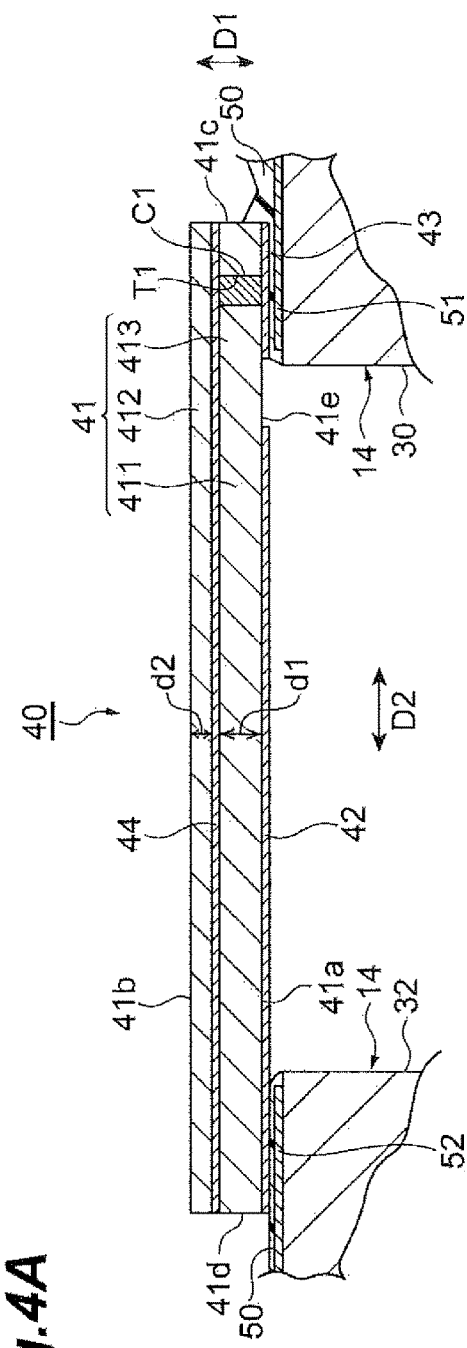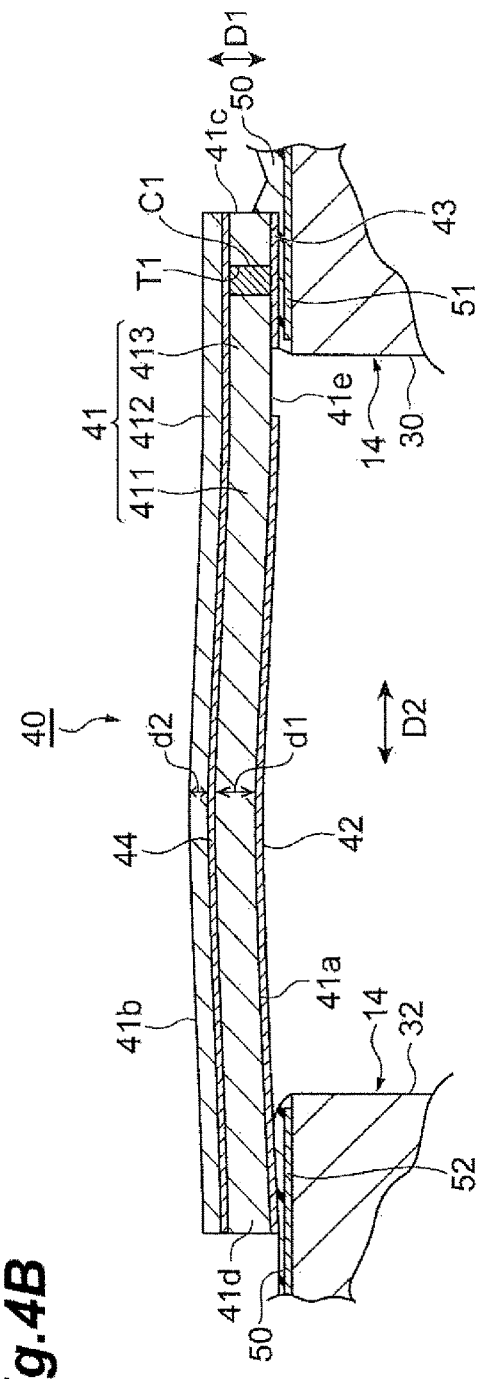

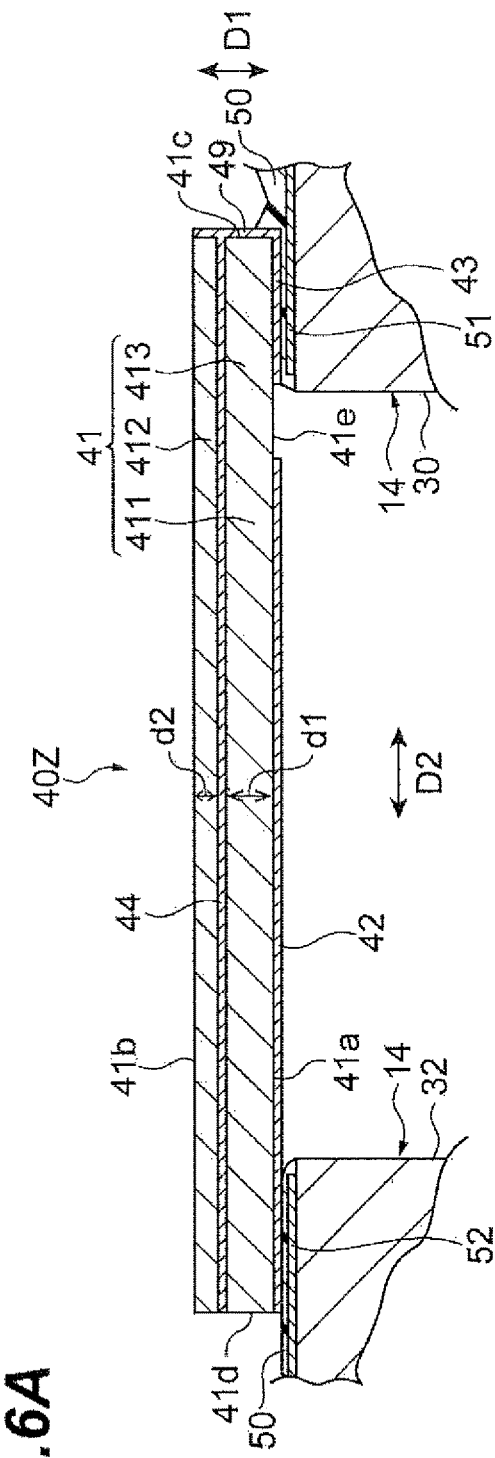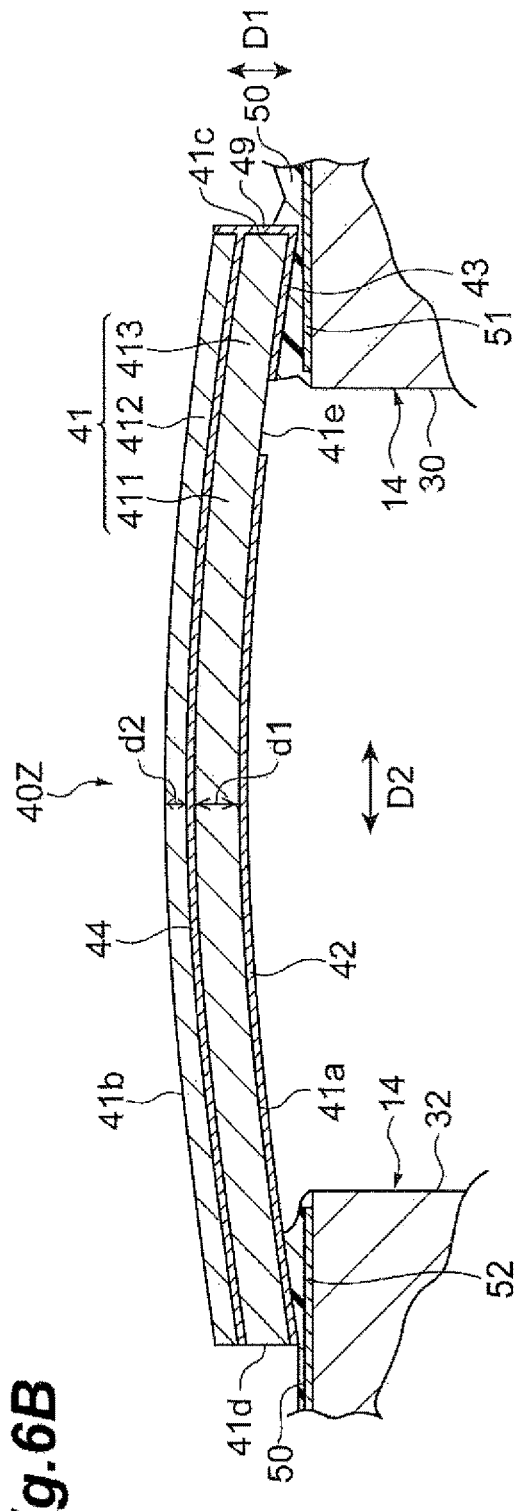

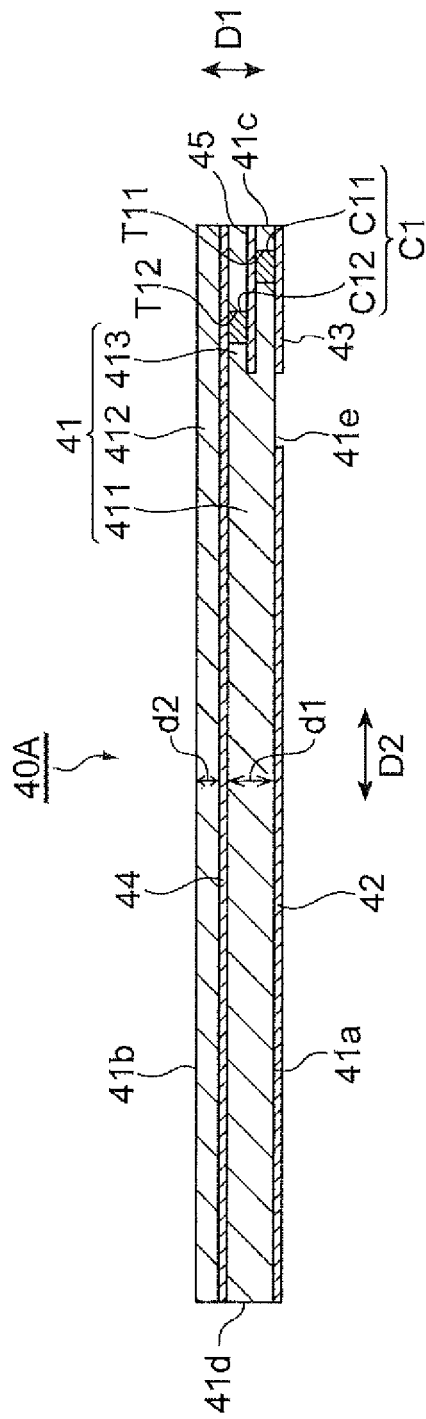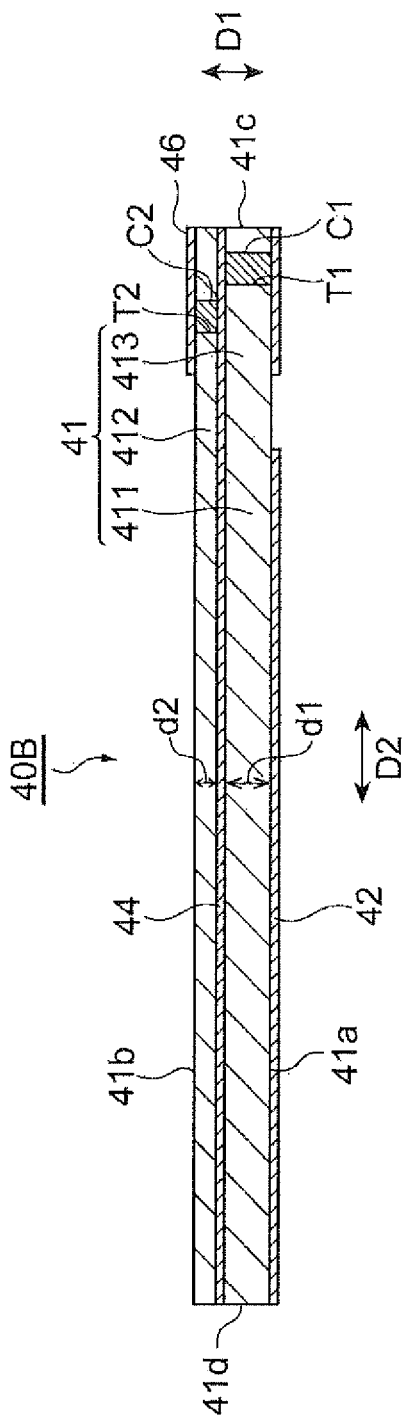

PIEZOELECTRIC ELEMENT AND PIEZOELECTRIC ACTUATOR

TECHNICAL FIELD

One aspect of the present invention relates to a piezoelectric element and a piezoelectric actuator.

BACKGROUND

Known piezoelectric actuators include a piezoelectric element including first and second main surfaces opposing each other and a supporting member supporting the piezoelectric element (for example, refer to Japanese Unexamined Patent Publication No. 2012-155832). In the piezoelectric actuator described in Japanese Unexamined Patent Publication No. 2012-155832, an actuator base of a suspension for a hard disk device (HDD) corresponds to the above-described supporting member, and the piezoelectric element transmits displacement of the piezoelectric element to the actuator base.

SUMMARY

One aspect of the present invention is to provide a piezoelectric element and a piezoelectric actuator which can improve an amount of the displacement amount.

A piezoelectric element according to one aspect of the present invention includes a piezoelectric body, a first electrode, a second electrode, a third electrode, and a first through hole conductor. The piezoelectric body includes first and second main surfaces having rectangular shapes and opposing each other, and first and second end surfaces opposing each other in a long-side direction of the first and second main surfaces. The first electrode is disposed on the first main surface. The second electrode is disposed apart from the first electrode on an end portion on the first end surface side on the first main surface. The third electrode is disposed in the piezoelectric body to oppose first electrode. The first through hole conductor is disposed in an end portion on the first end surface side in the piezoelectric body and electrically connected to the second and third electrodes. The piezoelectric body includes an active region and an inactive region. The active region includes a region from the first electrode to the third electrode. The inactive region includes a region from the third electrode to the second main surface.

In the piezoelectric element according to one aspect of the present invention, the first main surface side of the piezoelectric body is an active region, and the second main surface side of the piezoelectric body is an inactive region. Consequently, in the piezoelectric body, a displacement amount on the first main surface side becomes larger than a displacement amount on the second main surface side. Therefore, the piezoelectric element tries to be bent in such a manner that the first main surface side comes to a curved outer side when the piezoelectric element displaces in an extending direction. Therefore, even in the case where, for example, the first main surface side is supported by a supporting member, and a binding force acting from the first main surface side to the piezoelectric element is larger than a binding force acting from the second main surface side to the piezoelectric element, a bending of the piezoelectric element by a difference in the binding force is suppressed. Further, a mechanical strength is high at an end portion on the first end surface side of the piezoelectric body since the first through hole conductor is disposed. Therefore, a bending of the piezoelectric element by a difference in a binding force is further suppressed. In this manner, a deformation of the piezoelectric element is suppressed, a displacement of the piezoelectric element can be appropriately transmitted the supporting member. As a result, an amount of the displacement to be transmitted from the piezoelectric element to the supporting member can be improved.

In a piezoelectric element according to one aspect of the prevent invention, an interval between the third electrode and the first main surface may be larger than an interval between the third electrode and the second main surface. In this case, in comparison with the case where the interval between the third electrode and the first main surface is equal to or less than the interval between the third electrode and the second main surface, a displacement of the piezoelectric element is not excessively suppressed by an inactive region. Therefore, a displacement amount of the piezoelectric element can be easily improved.

The piezoelectric element according to one aspect of the present invention may further include a fourth electrode disposed between the second electrode and the third electrode. The first through hole conductor may include a first conductor connected to the second and fourth electrodes and the second conductor connected to the third and fourth electrodes. In this case, for example, even if the first and second conductors are shrunk during firing, a shrinking amount of each of the first and second conductors becomes small in comparison with a shrinking amount of the entire first through hole conductor in the case where the first and second conductors are not separated. Therefore, the occurrence of a conduction failure in the first through hole conductor can be suppressed.

In the piezoelectric element according to one aspect of the present invention, the first conductor and the second conductor may be apart from each other when viewed from a direction in which the first main surface and the second main surface oppose each other. In this case, the first and second conductors are connected to a different portion in the fourth electrode. Therefore, for example, even if the first and second conductor are shrunk during firing, the occurrence of a conduction failure in the first through hole conductor can be further suppressed.

In the piezoelectric element according to one aspect of the present invention, the first conductor may be disposed closer to the first end surface than the second conductor. In this case, in comparison with the case where the second conductor is disposed closer to the first end surface than the first conductor, an area of the second electrode can be reduced, and also an area of the first electrode can be increased. Accordingly, an active region can be increased. As a result, a displacement amount of the piezoelectric element can be easily improved.

The piezoelectric element according to one aspect of the present invention further includes a fifth electrode and a second through hole conductor. The fifth electrode is disposed on the second main surface. The second through hole conductor is disposed in an end portion on the first end surface side of a piezoelectric body and may be electrically connected to the third electrode and the fifth electrode. In this case, the second and fifth electrodes mechanically connected by the first and second through hole conductors sandwich an end portion on the first end surface side of the piezoelectric body. Therefore, mechanical strength increases at the end portion on the first end surface side of the piezoelectric body.

A piezoelectric actuator according to one aspect of the present invention may include the above-described piezoelectric element and a supporting member supporting the piezoelectric element on a first main surface side. The supporting member may include a first connecting portion electrically connected to the first electrode and a second connecting portion electrically connected to the second electrode.

In the piezoelectric actuator according to one aspect of the present invention, as described above, the first main surface side of the piezoelectric element is supported by the supporting member. Therefore, even in the case where a binding force acting from the first main surface side to the piezoelectric element is larger than a binding force acting from the second main surface side to the piezoelectric element, a deformation of the piezoelectric element by a difference in the binding force is suppressed. In this manner, a displacement of the piezoelectric element can be appropriately transmitted to the supporting member. As a result, a displacement amount can be improved. In addition, both of the first and second electrodes are disposed on the first main surface. Therefore, the first and second connecting portion of the supporting member can be collected on the first main surface side.

BRIEF DESCRIPTION OF THE DRAWINGS

FIG. 3 is a plan view when a piezoelectric element illustrated in FIG. 1 is viewed from a first main surface side;

FIGS. 4A and 4B are sectional views to describe movement of the suspension illustrated in FIG. 1;

FIGS. 6A and 6B are sectional views to describe movement of a piezoelectric actuator according to a comparison example;

FIGS. 8A and 8B are sectional views illustrating a configuration of a piezoelectric element according to second and third embodiments.

DETAILED DESCRIPTION

Embodiments of the present invention will be described below with reference to attached drawings. In the description, the same signs are used for the same elements or for elements having the same functions, and a duplicated description will be omitted.

First Embodiment

Figure 1:
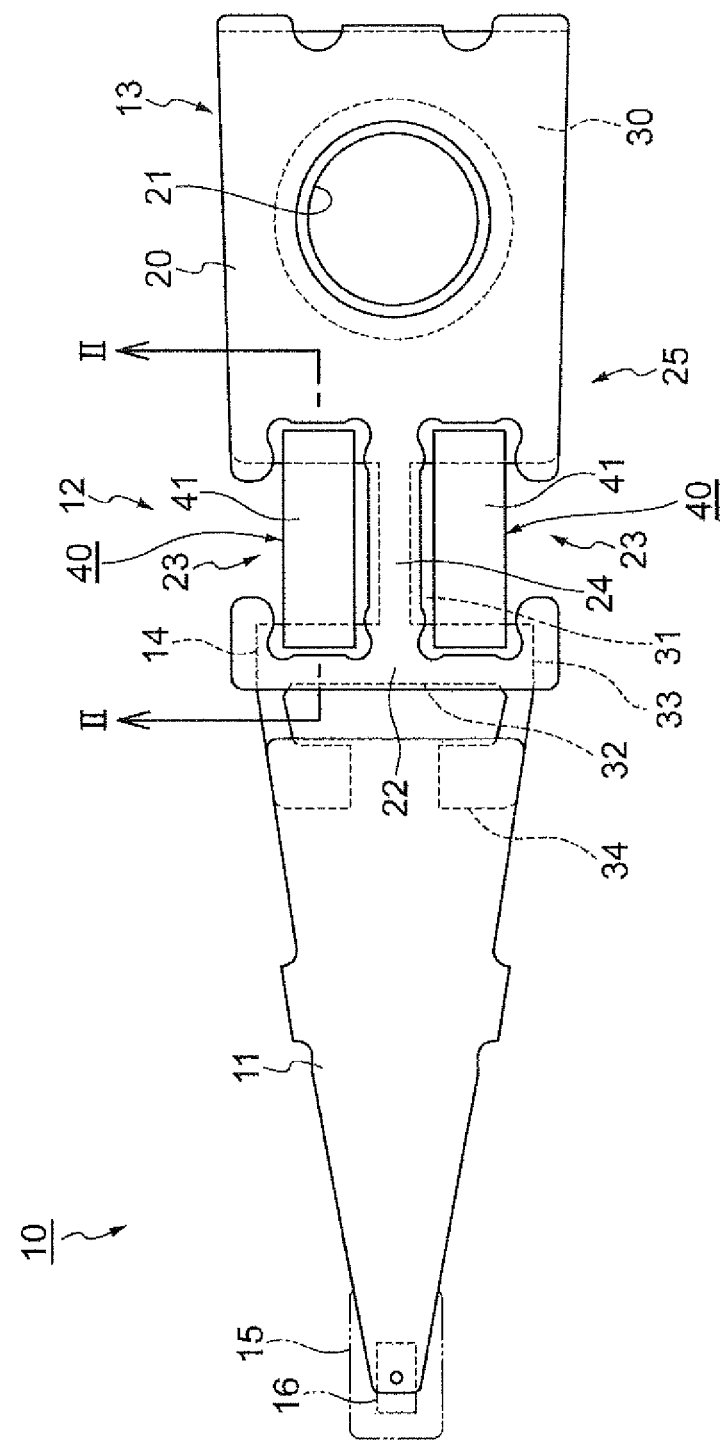
FIG. 1 is a schematic plan view illustrating a suspension according to a first embodiment.
Figure 2:
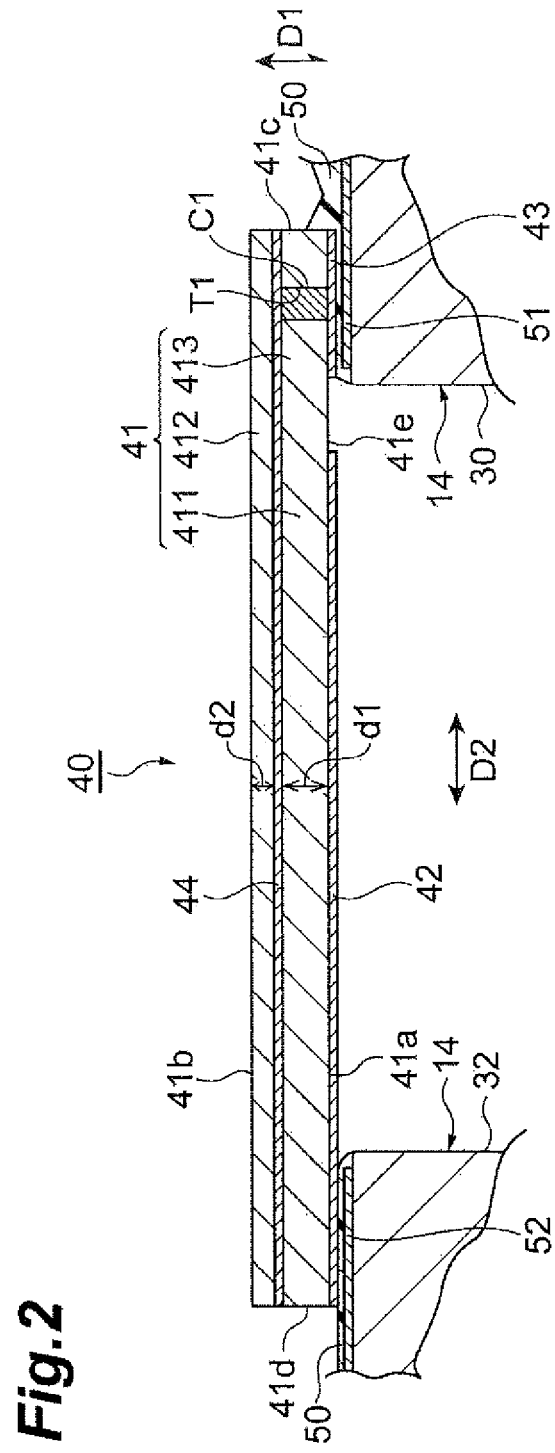
FIG. 2 is a sectional view along line II-II illustrated in FIG. 1.

A configuration of a piezoelectric actuator according to a first embodiment will be described with reference to FIGS. 1 to 3. The first embodiment is an example in which a suspension 10 for HDD includes a piezoelectric actuator. FIG. 1 is a schematic plan view illustrating the suspension according to the first embodiment. FIG. 2 is a sectional view along line II-II illustrated in FIG. 1. FIG. 3 is a plan view when a piezoelectric element illustrated in FIG. 1 is viewed from a first main surface side.

The suspension 10 by a dual actuator method illustrated in FIG. 1 includes a load beam 11, a micro actuator 12, a base plate 13, and a hinge member 14.

The load beam 11 includes a metal plate having a spring characteristic. A thickness of the load beam 11 is, for example, approximately 100 µm. A flexure 15 is attached at a top of the load beam 11. The flexure 15 includes a thinner metal spring than the load beam 11. A slider 16 forming a magnetic head is disposed at a front end portion of the flexure 15.

A round boss hole 21 is formed on a base portion 20 of the base plate 13. A pair of openings 23 is formed between the base portion 20 of the base plate 13 and a front end portion 22. Each of the openings 23 has a size capable of storing a piezoelectric element 40 to be described later. A band-like joint portion 24 is provided between a pair of the openings 23. The joint portion 24 extends in a longitudinal direction of the base plate 13 (a longitudinal direction of the suspension 10). The joint portion 24 is formed so as to allow bending within a predetermined range in a wide direction of the base plate 13 (a direction crossing with the longitudinal direction of the suspension 10).

A base portion 20 of the base plate 13 is fixed to a tip of an actuator arm. The actuator arm is driven by a voice coil motor (not illustrated). Therefore, the base plate 13 is revolvingly driven by the voice coil motor. The base plate 13 includes a metal plate such as a stainless steel. A thickness of the base plate 13 is, for example, approximately 200 µm. In the case of the embodiment, an actuator base 25 includes the base plate 13 and the hinge member 14.

The hinge member 14 includes a base portion 30, a bridge portion 31, an intermediate portion 32, a pair of hinge units 33, and a tip portion 34. The base portion 30 is stacked and fixed on the base portion 20 of the base plate 13. The bridge portion 31 has a belt shape and is formed at a position corresponding to the joint portion 24 of the base plate 13. The intermediate portion 32 is formed at a position corresponding to the front end portion 22 of the base plate 13. Each hinge unit 33 has flexibility elastically deformable in a plate thickness direction. The tip portion 34 is fixed on the load beam 11. The hinge member 14 includes a metal plate having a spring characteristic. A thickness of the hinge member 14 is, for example, approximately 50 µm.

A pair of the piezoelectric elements 40 is disposed on the micro actuator 12. Each of the piezoelectric elements 40 is a laminated piezoelectric element. Each of the piezoelectric elements 40 includes a piezoelectric body 41, a first electrode 42, a second electrode 43, a third electrode 44, and a first through hole conductor C1, as illustrated also in FIG. 2.

The piezoelectric body 41 has a rectangular plate shape. The piezoelectric body 41 includes first and second main surfaces 41a and 41b and first and second end surfaces 41c and 41d. The first and second main surfaces 41a and 41b have a rectangular shape. The first and second main surfaces 41a and 41b oppose each other in a thickness direction (a first direction D1) of the piezoelectric body 41. The rectangular shape includes a rectangular shape in which corners are chamfered and a rectangular shape in which corners are rounded. The first and second end surfaces 41c and 41d oppose each other in a longitudinal direction (a second direction D2) of the first and second main surfaces 41a and 41b. The first and second end surfaces 41c and 41d extend in the first direction D1 and connect the first and second main surfaces 41a and 41b.

An outer dimension of the piezoelectric body 41 is, for example, 1.5 mm in length in a longitudinal direction, 0.35 mm in length in a short-length direction, and 0.06 mm in thickness. The piezoelectric body 41 includes piezoelectric ceramic. Examples of the piezoelectric ceramic include PZT

[Pb (Zr, Ti) $O_3$], PT [PbTiO$_3$], PLZT [(Pb, La) (Zr, Ti) $O_3$], and barium titanate [BaTiO$_3$]. The piezoelectric body 41 includes, for example, piezoelectric ceramic material such as PZT.

As illustrated in FIG. 3, each of the first and second electrodes 42 and 43 is disposed on the first main surface 41*a*. Each of the first and second electrodes 42 and 43 has a rectangular shape. Both ends of the first electrode 42 in a short-length direction of the first main surface 41*a* coincide with both ends of the piezoelectric body 41 in a short-length direction of the first main surface 41*a* when viewed from the first direction D1. One end of the second direction D2 of the first electrode 42 coincides with the second end surface 41*d* when viewed from the first direction D1. Another end of the second direction D2 of the first electrode 42 is separated from the first end surface 41*c* when viewed from the first direction D1. A length of the second direction D2 of the first electrode 42 is, for example, 1.2 mm.

Both ends of the second electrode 43 in a short-length direction of the first main surface 41*a* coincide with both ends of the piezoelectric body 41 in a short-length direction of the first main surface 41*a* when viewed from the first direction D1. One end of the second direction D2 of the second electrode 43 is separated from the second end surface 41*d* when viewed from the first direction D1. Another end of the second direction D2 of the second electrode 43 coincides with the first end surface 41*c* when viewed from the first direction D1. A length of the second direction D2 of the second electrode 43 is, for example, 0.2 mm.

A separation distance between another end of the second direction D2 of the first electrode 42 and the first end surface 41*c* is longer than a length of the second direction D2 of the second electrode 43. The separation distance is, for example, 0.3 mm. Specifically, the first and second electrodes 42 and 43 are disposed with an interval in the second direction D2. A region exposed from the first and second electrodes 42 and 43 on the first main surface 41*a*, in other words, a length of the second direction D2 of an exposed region 41*e* is, for example, 0.1 mm.

Thicknesses of the first and second electrodes 42 and 43 are approximately 200 to 500 nm. The first and second electrodes 42 and 43 include a Cr/Ni—Cu/Au laminated structure (in the structure, a Cr layer, an Ni—Cu alloy layer, and an Au layer are laminated from a piezoelectric body 41 side in order). That is, the first and second electrodes 42 and 43 have the same laminated structure. The first and second electrodes 42 and 43 are formed, for example, by a spattering method. The first and second electrodes 42 and 43 may be formed by a method other than the spattering method (for example, a baking method, an electrolytic plating method, or a deposition method). The first and second electrodes 42 and 43 may be formed as a same single metal layer (for example, a Cr layer, an Ni—Cu alloy layer, an Au layer, or an Ni layer).

The third electrode 44 opposes with the first and second main surfaces 41*a* and 41*b*. The third electrode 44 is disposed substantially parallel to the first and second main surfaces 41*a* and 41*b*. That is, the third electrode 44 is disposed in the piezoelectric body 41 and opposes with the first electrode 42. An end portion on the first end surface 41*c* side of the third electrode 44 is exposed on the first end surface 41*c*. An end portion on the second end surface 41*d* side of the third electrode 44 is exposed on the second end surface 41*d*. A thickness of the third electrode 44 is approximately 1 µm. The third electrode 44 includes a conductive material (for example, Ag, Pd, Au, Pt or alloy thereof) generally used as an internal electrode of a laminated electrical element. The third electrode 44 is formed as a fired body of conductive paste including the above-described conductive material.

The piezoelectric body 41 includes first to third regions 411 to 413 defined by the first to third electrodes 42 to 44. The first region 411 is a region from the first electrode 42 to the third electrode 44. The second region 412 is a region from the third electrode 44 to the second main surface 41*b*. The second region 412 is ranged from the first end surface 41*c* to the second end surface 41*d*. That is, both ends in the second direction D2 of the second region 412 coincide with both ends in the second direction D2 of the piezoelectric body 41. The third region 413 is a region other than the first and second regions 411 and 412. The third region is a region from the second electrode 43 and the exposed region 41*e* to the third electrode 44. The third region 413 is a part of a region at an end portion on the first end surface 41*c* side.

A first through hole T1 is provided in the third region 413. The first through hole T1 is disposed at a position where a center axis of the first through hole T1 is, for example, 0.1 mm apart from the first end surface 41*c*. The first through hole T1 is provided at the center of the short-length direction of the first and second main surfaces 41*a* and 41*b*. A diameter of the first through hole T1 is, for example, 0.03 mm. The first through hole T1 penetrates the third region 413 in the first direction D1. A length of the first direction D1 of the first through hole T1 is, for example, 0.04 mm.

The first region 411 is a piezoelectrically active region, that is, an active region. When a predetermined voltage is applied between the first and second electrodes 42 and 43, an electric field is applied to the first region 411. As a result, the first region 411 is displaced. The second and third regions 412 and 413 are a piezoelectrically inactive region, that is, an inactive region. When a predetermined voltage is applied between the first and second electrodes 42 and 43, an electric field is applied to the second and third regions 412 and 413. As a result, the second and third regions 412 and 413 are displaced.

An interval d1 between the third electrode 44 and the first main surface 41*a* in the first direction D1 is longer than an interval d2 between the third electrode 44 and the second main surface 41*b* in the first direction D1. The interval d1 is, for example, approximately 0.4 mm. The interval d2 is, for example, approximately 0.2 mm.

The first through hole conductor C1 is disposed in the first through hole T1. That is, the first through hole conductor C1 is disposed in an end portion on the first end surface 41*c* side in the piezoelectric body 41. The first through hole conductor C1 is electrically connected to the second electrode 43 and the third electrode 44. Accordingly, the second electrode 43 and the third electrode 44 have the same polarity. The first through hole conductor C1 includes, for example, materials such as Pt and Pd which have higher hardness than the piezoelectric body 41.

Each piezoelectric element 40 is stored in the corresponding opening 23 in such a manner that a longitudinal direction of the piezoelectric element 40 is disposed along a longitudinal direction of the base plate 13 (an axial direction of the suspension 10). That is, each piezoelectric element 40 is disposed to a corresponding opening 23.

Each piezoelectric element 40 is supported by a base portion 30 of the hinge member 14 at an end portion on the first end surface 41*c* side. Each piezoelectric element 40 is fixed to the base portion 30 via a conductive resin 50. More specifically, the second electrode 43 and the first end surface 41*c* are fixed to the base portion 30 via the conductive resin 50. The conductive resin 50 is a resin including a conductive material (for example, such as metallic particles) The base portion 30 includes a connecting portion 51. The connecting portion 51 opposes with the second electrode 43. The connecting portion 51 is electrically connected to the second electrode 43 via the conductive resin 50.

Each piezoelectric element 40 is supported by an intermediate portion 32 of the hinge member 14 at an end portion on the second end surface 41d side. Each piezoelectric element 40 is fixed to the intermediate portion 32 via the conductive resin 50. More specifically, the first electrode 42 is fixed to the intermediate portion 32 via the conductive resin 50. The intermediate portion 32 includes a connecting portion 52. The connecting portion 52 opposes with the first electrode 42. The connecting portion 52 is electrically connected to the first electrode 42 via the conductive resin 50.

As described above, the piezoelectric element 40 is bound and supported by the base portion 30 and the intermediate portion 32. The base portion 30 and the intermediate portion 32 function as supporting members binding and supporting the piezoelectric element 40. That is, the piezoelectric element 40 is bound and supported by the supporting member at both ends in the second direction D2 in a state in which a binding force acting from the first main surface 41a side to the piezoelectric body 41 is larger than a binding force acting from the second main surface 41b side to the piezoelectric body 41. In the embodiment, the suspension 10 includes a piezoelectric actuator including the piezoelectric element 40 and the supporting member.

Figure 5:
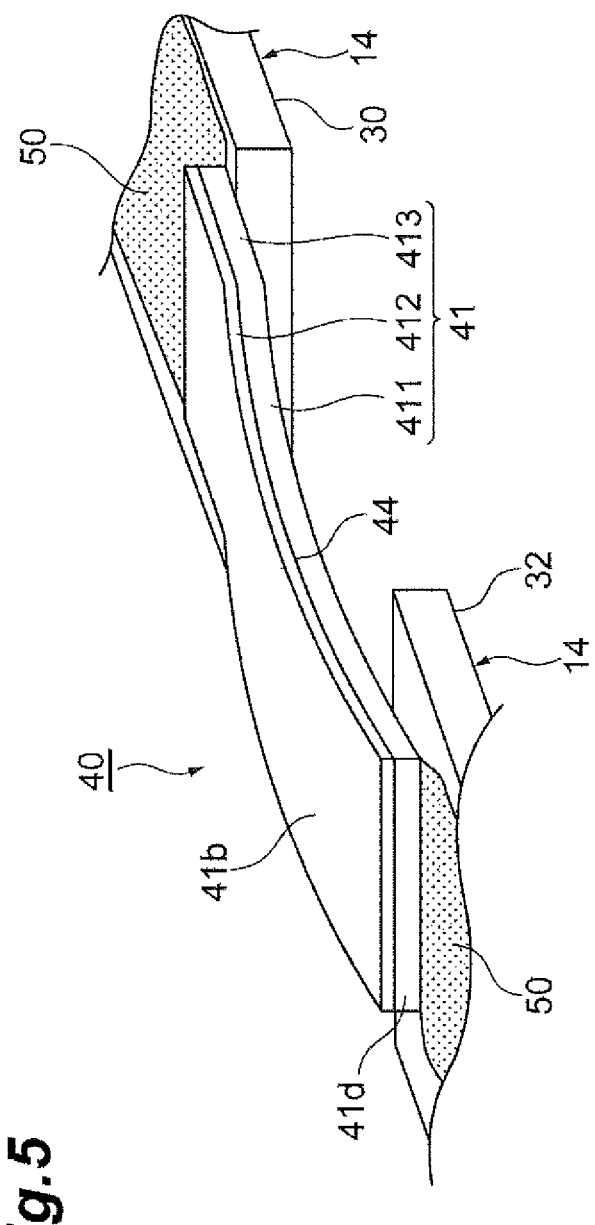
FIG. 5 is a perspective view to describe movement of the suspension illustrated in FIG. 1.

Next, with reference to FIGS. 4A, 4B, and 5, movement of the suspension 10 (piezoelectric actuator) will be described. FIGS. 4A and 4B are sectional views to describe movement of the suspension illustrated in FIG. 1. FIG. 5 is a perspective view to describe movement of the suspension illustrated in FIG. 1.

In the piezoelectric element 40 illustrated in FIG. 4A, a voltage is not applied between the first and second electrodes 42 and 43. Therefore, an electric field is not applied to the piezoelectric body 41. When the predetermined electric field is applied between the first and second electrodes 42 and 43, through the first through hole conductor C1 and the third electrode 44, the predetermined electric field is applied to the first region 411 in the piezoelectric body 41. As a result, the first region 411 tries to extend in the second direction D2.

As described above, the piezoelectric element 40 is bound and supported by a supporting member at both ends in the second direction D2 in a state in which a binding force acting from the first main surface 41a side to the piezoelectric body 41 is larger than a binding force acting from the second main surface 41b side to the piezoelectric body 41. By this difference in the binding forces, a displacement in a region on the first main surface 41a side of the piezoelectric body 41 is more easily blocked than a displacement in a region on the second main surface 41b side of the piezoelectric body 41. Therefore, the piezoelectric element 40 tries to be bent in such a manner that the second main surface 41b side comes to a curved outer side.

The second region 412 disposed on the second main surface 41b side of the piezoelectric body 41 is an inactive region. Therefore, the second region 412 is not displaced and suppresses a bending of the piezoelectric element 40. The third region 413 is an inactive region and therefore also is not displaced. In addition, the first through hole conductor C1 is provided in the third region 413, and therefore the third region 413 has high mechanical strength. Therefore, by integrating with the supporting member, the third region 413 suppresses the bending of the piezoelectric element 40.

As a result, as illustrated in FIGS. 4B and 5, the piezoelectric element 40 is displaced in a state in which the bending of the piezoelectric element 40 in which the first main surface 41a side comes to a curved outer side is suppressed. In this manner, a bending deformation of the piezoelectric element 40 is suppressed. Therefore, a displacement of the piezoelectric element 40 can be appropriately transmitted to a supporting member. Thus, in the embodiment, the bending deformation of the piezoelectric element 40 is suppressed, and the displacement of the piezoelectric element 40 (displacement in an extending direction) can be appropriately transmitted to the supporting member.

Figure 7:
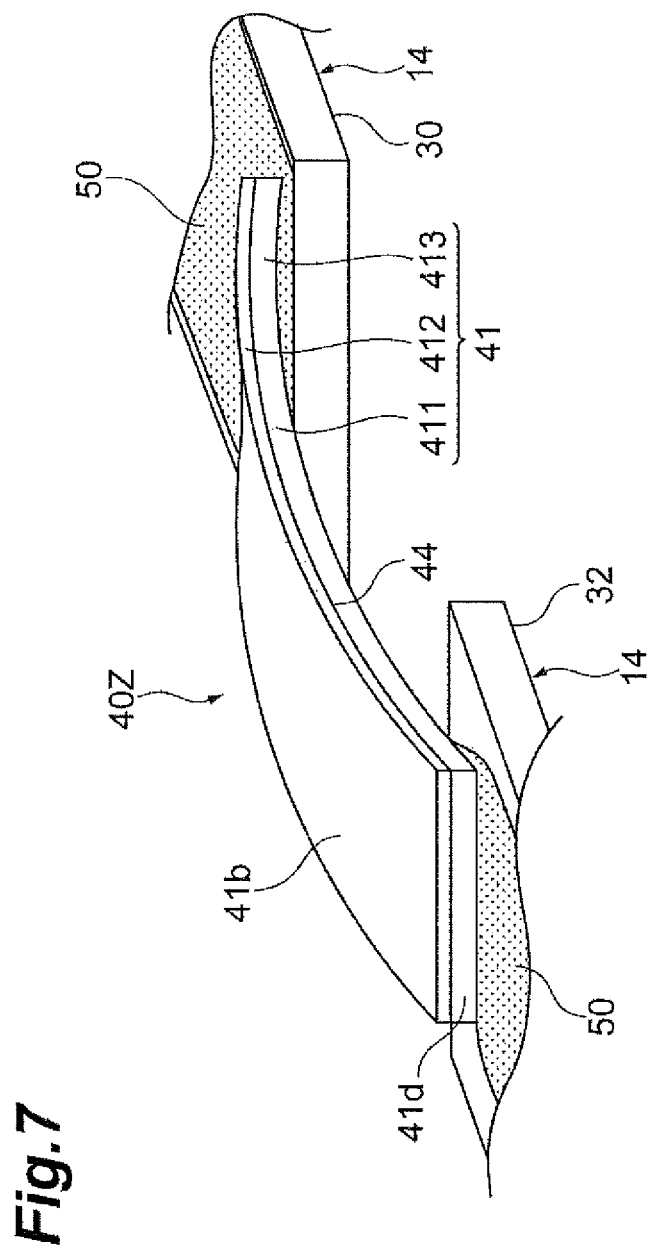
FIG. 7 is a perspective view to describe movement of the piezoelectric actuator according to the comparison example.

With reference to FIGS. 6A, 6B, and 7, movement of a piezoelectric element and a piezoelectric actuator according to a comparison example will be described. FIGS. 6A and 6B are sectional views to describe the movement of a piezoelectric actuator according to the comparison example. FIG. 7 is a perspective view to describe the movement of the piezoelectric actuator according to the comparison example.

As illustrated in FIG. 6A, a piezoelectric element 40Z according to the comparison example differs from the piezoelectric element 40 mainly in the point that an end surface electrode 49 is included instead of the first through hole conductor C1. The piezoelectric element 40Z coincides with the piezoelectric element 40 in the other points. The end surface electrode 49 is entirely disposed on the first end surface 41c. The end surface electrode 49 is electrically connected to an end portion on the first end surface 41c side of the third electrode 44.

As in the piezoelectric element 40 illustrated in FIG. 4A, a voltage is not applied between first and second electrodes 42 and 43 in the piezoelectric element 40Z illustrated in FIG. 6A. Therefore, an electric field is not applied to the piezoelectric body 41. When a predetermined voltage is applied between the first and second electrodes 42 and 43, through the end surface electrode 49 and the third electrode 44, the predetermined electric field is applied to the first region 411 in the piezoelectric body 41. As a result, the first region 411 tries to extend in the second direction D2.

The piezoelectric element 40Z is bound and supported by a supporting member at both ends in the second direction D2 as well as the piezoelectric element 40. Therefore, from a difference in a binding force, the piezoelectric element 40Z tries to be bent in such a manner that the second main surface 41b side comes to a curved outer side. Here, the second region 412 suppresses a bending of the piezoelectric element 40Z as described above.

However, as illustrated in FIGS. 6B and 7, a bending of the piezoelectric element 40Z in which the second main surface 41b side comes to a curved outer side is not sufficiently suppressed by the second region 412. As described above, as a result of the occurrence of a bending deformation of the piezoelectric element 40Z, a displacement of the piezoelectric element 40Z (displacement in an extending direction) cannot be appropriately transmitted to a supporting member. For example, by increasing a thickness of the second region 412, the bending deformation of the piezoelectric element 40Z is suppressed. However, a thickness of the first region 411 is relatively reduced. Therefore, the displacement of the piezoelectric element 40Z is also suppressed, and a displacement amount of the piezoelectric element 40Z cannot be improved like the piezoelectric element 40.

As described above, in the piezoelectric element 40, the first main surface 41a side of the piezoelectric body 41 is an active region, and the second main surface 41b side of the piezoelectric body 41 is an inactive region. Consequently, in the piezoelectric body 41, a displacement amount on the first main surface 41a side becomes larger than a displacement amount on the second main surface 41b side. Therefore, the piezoelectric element 40 tries to be bent in such a manner that the first main surface 41a side comes to a curved outer side when the piezoelectric element 40 is displaced in an extending direction. Therefore, even in the case where the first main surface 41a side is supported by a supporting member, and a binding force acting from the first main surface 41a side to the piezoelectric element 40 is larger than a binding force acting from the second main surface 41b side to the piezoelectric element 40, a bending of the piezoelectric element 40 by the difference in the binding forces is suppressed.

Further, the first through hole conductor C1 is disposed in the third region 413 disposed at an end portion on the first end surface 41c side in the piezoelectric body 41. Accordingly, mechanical strength of the third region 413 is high. Therefore, a bending of the piezoelectric element 40 by the difference in the binding forces is further suppressed. In this manner, a bending deformation of the piezoelectric element 40 is suppressed. Therefore, a displacement of the piezoelectric element 40 can be appropriately transmitted to a supporting member. As a result, a displacement amount of the piezoelectric element 40 can be improved. As described above, in the case where a bending of the piezoelectric element 40 is suppressed by increasing a thickness of the second region 412, a displacement of the piezoelectric element 40 is also suppressed. On the other hand, in the embodiment, a bending of the piezoelectric element 40 is suppressed by using the third region 413 which is an inactive region. Therefore, a displacement of the piezoelectric element 40 is not suppressed.

In the piezoelectric element 40, the interval d1 is longer than the interval d2. That is, a thickness of the first region 411 which is an active region is thicker than, a thickness of the second region 412 which is an inactive region. Therefore, in comparison with the case where the interval d1 is equal to or less than the interval d2, a displacement of the piezoelectric element 40 is not excessively suppressed by an inactive region. Therefore, a displacement amount of the piezoelectric element 40 can be easily improved.

Thus, in a piezoelectric actuator, even in the case where the first main surface 41a side of the piezoelectric element 40 is supported by a supporting member, and a binding force acting from the first main surface 41a side to the piezoelectric element 40 is larger than a binding force acting from the second main surface 41b side to the piezoelectric element 40, a deformation of the piezoelectric element 40 by the difference in the binding forces is suppressed. In this manner, a displacement of the piezoelectric element 40 can be appropriately transmitted to the supporting member. As a result, a displacement amount of the piezoelectric actuator can be improved.

In the piezoelectric element 40, both of the first and second electrodes 42 and 43 are disposed on the first main surface 41a, and therefore connecting portions 51 and 52 of the supporting member can be collected on the first main surface 41a side.

Second Embodiment

With reference to FIG. 8A, a configuration of a piezoelectric element according to a second embodiment will be described. FIG. 8A is a sectional view illustrating the configuration of the piezoelectric element according to the second embodiment.

As illustrated in FIG. 8A, major differences between a piezoelectric element 40A according to the second embodiment and the piezoelectric element 40 according to the first embodiment are as follows. Specifically, in the piezoelectric element 40A, a fourth electrode 45 is included, a first through hole conductor C1 includes first and second conductors C11 and C12, and the first through hole includes through holes T11 and T12.

The fourth electrode 45 is disposed between a second electrode 43 and a third electrode 44 in a third region 413. The fourth electrode 45 opposes with the second and third electrodes 43 and 44. The fourth electrode 45 is disposed substantially parallel to the second and third electrodes 43 and 44. That is, the fourth electrode 45 is disposed in the piezoelectric body 41 and opposes with the second and third electrodes 43 and 44. An end portion on a first end surface 41c side of the fourth electrode 45 is exposed on the first end surface 41c. A length of a second direction D2 of the fourth electrode 45 is, for example, 0.2 mm. A thickness of the fourth electrode 45 is approximately 1 µm. The fourth electrode 45 includes same materials as, for example, the third electrode 44.

The through hole T11 is provided between the second electrode 43 and the fourth electrode 45 in the third region 413. The through hole T11 is disposed at a position where a center axis of the through hole T11 is, for example, 0.06 mm apart from the first end surface 41c. The through hole T11 is provided at a center of the short-length direction of first and second main surfaces 41a and 41b. A diameter of the through hole T11 is, for example, 0.03 mm. The through hole T11 penetrates a region between the second electrode 43 and the fourth electrode 45 in the first direction D1. A length of a first direction D1 of the through hole T11 is, for example, 0.02 mm.

The through hole T12 is provided between the fourth electrode 45 and the third electrode 44 in the third region 413. The through hole T12 is disposed at a position where a center axis of the through hole T12 is, for example, 0.14 mm apart from the first end surface 41c. The through hole T12 is provided at a center of the short-length direction of the first and second main surfaces 41a and 41b. A diameter of the through hole T12 is, for example, 0.03 mm. The through hole T12 penetrates a region between the fourth electrode 45 and the third electrode 44 in the first direction D1. A length of the through hole T12 in the first direction D1 is, for example, 0.02 mm.

The first conductor C11 is disposed in the through hole T11 and electrically connected to the second electrode 43 and the fourth electrode 45. The second conductor C12 is disposed in the through hole T12 and electrically connected to the fourth electrode 45 and the third electrode 44. The first conductor C11 and the second conductor C12 are disposed with an interval in the second direction D2 when viewed from the first direction D1. The first conductor C11 is disposed closer to the first end surface 41c than the second conductor C12.

In the piezoelectric element 40A configured as described above, the first main surface 41a side of the piezoelectric body 41 is an active region, and the second main surface 41b side of the piezoelectric body 41 is an inactive region. Further, the first through hole conductor C1 is disposed in the end portion on a first end surface 41c side in the piezoelectric body 41. Therefore, a bending of the piezoelectric element 40A by a difference in binding forces is suppressed. In this manner, a displacement of the piezoelectric element 40A can be appropriately transmitted to a supporting member. As a result, a displacement amount of the piezoelectric element 40A can be improved.

The first through hole conductor C1 is shrunk in association with firing of metallic materials during firing in manufacturing of the piezoelectric element 40. In this manner, a disconnection is caused between the first through hole conductor C1 and second and third electrodes 43 and 44, and a connecting area between the first through hole conductor C1 and the second and third electrodes 43 and 44 is decreased. As a length in the first direction D1 of the first through hole conductor C1 is increased, a volume of the first through hole conductor C1 is increased. As a result, an absolute shrinking amount of the first through hole conductor C1 is increased.

In the piezoelectric element 40A, the first through hole conductor C1 is separated into the first conductor C11 and the second conductor C12 which are electrically connected each other by the fourth electrode 45. That is, each of the lengths of the first direction D1 of the first and second conductors C11 and C12 is shorter than a length of the first direction D1 of the entire first through hole conductor C1 which is not separated. Therefore, a shrinking amount of each of the first and second conductors C11 and C12 is smaller than a shrinking amount of the entire first through hole conductor C1 which is not separated into the first and second conductors C11 and C12.

In this manner, a disconnection between the first conductor C11 and the second electrode 43 and a decrease in a connecting area between the first conductor C11 and the second electrode 43 are suppressed. Further, a disconnection between the second conductor C12 and the third electrode 44 and a decrease in a connecting area between the second conductor C12 and the third electrode 44 are suppressed. In the piezoelectric element 40A, as described above, the through holes T11 and T12 are short, and the first and second conductors C11 and C12 are short. Therefore, the occurrence of a conduction failure in the first through hole conductor C1 can be suppressed.

The first conductor C11 and the second conductor C12 are disposed with an interval and do not overlap each other when viewed from the first direction D1. That is, the first conductor C11 and the second conductor C12 are connected to different portions of the fourth electrode 45. Therefore, even in the case where the first and second conductors C11 and C12 are shrunk during firing, the occurrence of a conduction failure can be further suppressed in comparison with the case where the first conductor C11 and the second conductor C12 overlap each other when viewed from the first direction D1.

The first conductor C11 is disposed closer to the first end surface 41c than the second conductor C12. In this case, in comparison with the case where the second conductor C12 is disposed closer to the first end surface 41c than the first conductor C11, an area of the second electrode 43 can be reduced, and an area of the first electrode 42 can be increased. That is, an end portion on the second end surface 41d side of the second electrode 43 is approached to the first end surface 41c, and an end portion on the first end surface 41c side of the first electrode 42 can be apart from the second end surface 41d. Accordingly, a first region 411 which is an active region of the piezoelectric body 41 can be increased. As a result, a displacement amount of the piezoelectric element 40A can be easily improved.

Third Embodiment

A configuration of a piezoelectric element according to a third embodiment will be described with reference to FIG. 8B. FIG. 8B is a sectional view illustrating a configuration of the piezoelectric element according to the third embodiment.

As illustrated in FIG. 8B, major differences between a piezoelectric element 40B according to the third embodiment and the piezoelectric element 40 according to the first embodiment are as follows. Specifically, in the piezoelectric element 40B, a fifth electrode 46 is included, a second through hole conductor C2 is included in a second region 412, and a second through hole T2 is provided in the second region 412. The fifth electrode 46 is disposed on an end portion on a first end surface 41c side of a second main surface 41b. An end portion on the first end surface 41c side of the fifth electrode 46 coincides with the first end surface 41c when viewed from a first direction D1. The length of the second direction D2 of the fifth electrode 46 is, for example, 0.2 mm. The fifth electrode 46 includes same materials as, for example, first and second electrodes 42 and 43. A thickness of the fifth electrode 46 is, for example, same as thicknesses of the first and second electrodes 42 and 43.

A first through hole T1 is disposed at a position where a center axis of the first through hole T1 is, for example, 0.06 mm apart from the first end surface 41c. The second through hole T2 is provided in an end portion on the first end surface 41c side of the second region 412.

The second through hole T2 is provided closed to the second end surface 41d than the first through hole T1 when viewed from the first direction D1. The second through hole T2 is disposed at a position where a center axis of the second through hole T2 is, for example, 0.14 mm apart from the first end surface 41c. The second through hole T2 is provided at a center of the short-length direction of the first and second main surfaces 41a and 41b. A diameter of the second through hole T2 is, for example, 0.03 mm. The second through hole T2 penetrates the second region 412 in the first direction D1. A length of the first direction D1 of the second through hole T2 is, for example, 0.02 mm. The second through hole conductor C2 is disposed in the second through hole T2 and electrically connected to the fourth electrode 45 and the fifth electrode 46. The first through hole conductor C1 and the second through hole conductor C2 are apart from each other when viewed from the first direction D1.

In the piezoelectric element 40B configured as described above, the first main surface 41a side of the piezoelectric body 41 is an active region, and the second main surface 41b side of the piezoelectric body 41 is an inactive region. Further, the first through hole conductor C1 is disposed in the end portion on a first end surface 41c side in the piezoelectric body 41. Therefore, a bending of the piezoelectric element 40B by a difference in binding forces is suppressed. In this manner, a displacement of the piezoelectric element 40B can be appropriately transmitted to a supporting member. As a result, a displacement amount of the piezoelectric element 40B can be improved.

In addition, the second through hole conductor C2 is disposed in an end portion on the first end surface 41c side in the piezoelectric body 41. The first and second through hole conductors C1 and C2 connect the second and fifth electrodes 43 and 46 each other. As a result, the second and fifth electrodes 43 and 46 sandwich an end portion on the first end surface 41c side of the piezoelectric body 41. Therefore, mechanical strength increases at the end portion on the first end surface 41c side of the piezoelectric body 41. Consequently, a bending of the piezoelectric element 40B by a difference in binding forces is further suppressed. In this manner, a displacement of the piezoelectric element 40B can be appropriately transmitted to a supporting member. As a result, a displacement amount of the piezoelectric element 40B can be improved.

The piezoelectric element 40B includes the fifth electrode 46 and therefore can electrically connect on the second main surface 41b side. Therefore, a degree of freedom of design is increased. Further, the first through hole conductor C1 and the second through hole conductor C2 are disposed with an interval and do not overlap each other when viewed from the first direction D1. Therefore, in comparison with the case where the first through hole conductor C1 and the second through hole conductor C2 overlap each other when viewed from the first direction D1, the occurrence of a conduction failure in the first and second through hole conductors C1 and C2 can be suppressed.

The present invention is not limited to the above-described embodiment. The present invention may be changed within the gist described in each claim or may be applied to other embodiment.

For example, in the piezoelectric elements 40, 40A, and 40B, the interval d1 may be equal to or less than the interval d2. The piezoelectric element 40A may further include an electrode between the second electrode 43 and the fourth electrode 45, and the first through hole conductor C1 may further include a conductor connecting between the electrodes. In this case, the occurrence of a conduction failure in the first through hole conductor C1 can be further suppressed. In addition, the piezoelectric element 40B may not include the fifth electrode 46. Further, in the piezoelectric element 40A, the first conductor C11 and the second conductor C12 may partially overlap when viewed from the first direction D1. In this case, the occurrence of a conduction failure can be suppressed in comparison with the case where the first conductor C11 and the second conductor C12 entirely overlap when viewed from the first direction D1. Further, in the piezoelectric element 40B, the first through hole conductor C1 and the second through hole conductor C2 may partially overlap each other when viewed from the first direction D1. In this case, the occurrence of a conduction failure can be suppressed in comparison with the case where the first through hole conductor C1 and the second through hole conductor C2 entirely overlap each other when viewed from the first direction D1.

The present invention can be used in a piezoelectric actuator other than the micro actuator 12 of the suspension 10 for HDD.

What is claimed is:
1. A piezoelectric actuator, comprising:
a piezoelectric element;
a supporting member supporting the piezoelectric element; and
a conductive resin that fixes the piezoelectric element to the supporting member,
wherein the piezoelectric element comprises:
a piezoelectric body having a rectangular shape and comprising first and second main surfaces opposing each other, and first and second end surfaces opposing each other in a long-side direction of the first and second main surfaces;
a first electrode disposed on the first main surface;
a second electrode disposed on an end portion on the first end surface side on the first main surface, the second electrode being separated from the first electrode by a gap in the long-side direction;
a third electrode disposed in the piezoelectric body to oppose the first electrode;
a fourth electrode disposed between the second electrode and the third electrode; and
a first through hole conductor disposed in an end portion on the first end surface side of the piezoelectric body and electrically connected to the second electrode and the third electrode,
wherein the piezoelectric body comprises an active region that includes a region from the first electrode to the third electrode, and an inactive region that includes a region from the third electrode to the second main surface,
a thickness of the active region is thicker than a thickness of the inactive region,
no portion of the piezoelectric body is disposed in the gap between the first electrode and the second electrode, and
the first through hole conductor comprises:
a first conductor connected to the second electrode and the fourth electrode; and
a second conductor connected to the third electrode and the fourth electrode.

2. The piezoelectric actuator according to claim 1, wherein an interval between the third electrode and the first main surface is longer than an interval between the third electrode and the second main surface.

3. The piezoelectric actuator according to claim 1, wherein the first conductor and the second conductor are disposed with an interval when viewed from a direction in which the first main surface and the second main surface oppose each other.

4. The piezoelectric actuator according to claim wherein the first conductor is disposed closer to the first end surface than the second conductor.

5. The piezoelectric actuator according to claim 1, further comprising:
a fifth electrode disposed on the second main surface;
a second through hole conductor disposed in the end portion on the first end surface side of the piezoelectric body and electrically connected to the third electrode and the fifth electrode.

6. The piezoelectric actuator according to claim 1, wherein
the supporting member supports the piezoelectric element on the first main surface side, and
the supporting member comprises:
a first connecting portion electrically connected to the first electrode via the conductive resin; and
a second connecting portion electrically connected to the second electrode via the conductive resin.

7. A piezoelectric actuator, comprising:
a piezoelectric element;
a supporting member supporting the piezoelectric element; and
a conductive resin that fixes the piezoelectric element to the supporting member,
wherein the piezoelectric element comprises:
a piezoelectric body having a rectangular shape and comprising first and second main surfaces opposing each other in a thickness direction, and first and second end surfaces opposing each other in a long-side direction of the first and second main surfaces;
a first electrode disposed on the first main surface;
a second electrode disposed on an end portion on the first end surface side on the first main surface, the second electrode being separated from the first electrode by a gap in the long-side direction;

a third electrode disposed inside the piezoelectric body between a first layer of the piezoelectric body and a second layer of the piezoelectric body in the thickness direction to oppose the first electrode in the thickness direction;

a fourth electrode disposed between the second electrode and the third electrode; and a first through hole conductor disposed in an end portion on the first end surface side of the piezoelectric body and electrically connected to the second electrode and the third electrode, wherein the piezoelectric body comprises an active region that includes a region in the first layer from the first electrode to the third electrode, and an inactive region that includes a region in the second layer from the third electrode to the second main surface, a thickness of the active region is thicker than a thickness of the inactive region, no portion of the piezoelectric body is disposed in the gap between the first electrode and the second electrode, and the first through hole conductor comprises:
- a first conductor connected to the second electrode and the fourth electrode; and
- a second conductor connected to the third electrode and the fourth electrode.

\* \* \* \* \*